(12) United States Patent
Miyazawa et al.

(10) Patent No.: US 7,919,224 B2
(45) Date of Patent: Apr. 5, 2011

(54) COATING MATERIALS CONSISTING OF LOW- OR MEDIUM-MOLECULAR ORGANIC COMPOUNDS

(75) Inventors: Satoru Miyazawa, Fujimino (JP); Satoru Kobayashi, Iruma-gun (JP); Kazuhiko Maeda, Hino (JP)

(73) Assignee: Central Glass Company, Limited, Ube-shi (JP)

( * ) Notice: Subject to any disclaimer, the term of this patent is extended or adjusted under 35 U.S.C. 154(b) by 304 days.

(21) Appl. No.: 12/088,455

(22) PCT Filed: Sep. 5, 2006

(86) PCT No.: PCT/JP2006/317552
§ 371 (c)(1),
(2), (4) Date: Mar. 28, 2008

(87) PCT Pub. No.: WO2007/037101
PCT Pub. Date: Apr. 5, 2007

(65) Prior Publication Data
US 2009/0272295 A1    Nov. 5, 2009

(30) Foreign Application Priority Data

Sep. 28, 2005  (JP) ................. 2005-283109
Aug. 10, 2006  (JP) ................. 2006-218003

(51) Int. Cl.
G03F 7/00 (2006.01)
G03F 7/032 (2006.01)
C08G 63/02 (2006.01)

(52) U.S. Cl. .............. 430/270.1; 430/905; 430/908; 528/272; 528/296; 528/302; 528/305

(58) Field of Classification Search ........... 430/270.1, 430/905, 908; 528/272, 296, 302, 305
See application file for complete search history.

(56) References Cited

U.S. PATENT DOCUMENTS

| | | | |
|---|---|---|---|
| 6,197,880 B1 | 3/2001 | Nigam | |
| 6,572,690 B2 | 6/2003 | Rehman et al. | |
| 7,005,248 B2 * | 2/2006 | Kurosawa et al. | 430/322 |
| 7,517,635 B2 * | 4/2009 | Miyazawa et al. | 430/270.1 |
| 2004/0062878 A1 | 4/2004 | Mano et al. | 428/1.1 |
| 2008/0003517 A1 | 1/2008 | Komoriya et al. | |
| 2008/0050674 A1 * | 2/2008 | Miyazawa et al. | 430/273.1 |
| 2009/0182114 A1 * | 7/2009 | Kusaka et al. | 528/289 |

FOREIGN PATENT DOCUMENTS

| | | |
|---|---|---|
| EP | 1 418 618 A | 5/2004 |
| JP | 63 057657 A | 3/1988 |
| JP | 07 005707 B | 1/1995 |
| JP | 07 209649 A | 8/1995 |
| JP | 9-95533 A | 4/1997 |
| JP | 11-60732 A | 3/1999 |
| JP | 11 237740 A | 8/1999 |
| JP | 2002-512313 A | 4/2002 |
| JP | 2002-332443 A | 11/2002 |
| JP | 2005-232095 A | 9/2005 |

OTHER PUBLICATIONS

International Search Report dated Oct. 24, 2006 with English translation of relevant portion (Five (5) pages).
PCT/ISA/237 dated Oct. 24, 2006 (Three (3) pages).
Takuya Hagiwara et al., *Characterization of Fluoropolymer Resist for 157-nm Lithography*, Journal of Photopolymer Science and Technology, vol. 16, No. 4, 2003, pp. 557-564.
Francis Houlihan et al., *New Fluorinated Resins for 157 nm Lithography Application*, Journal of Photopolymer Science and Technology, vol. 16, No. 4, 2003, pp. 581-590.
Shinichi Kanna et al., *A HFIPS-based Polymer Approach for 157 nm Single Layer Photoresist*, Journal of Photopolymer Science and Technology, vol. 16, No. 4, 2003, pp. 595-600.
Takashi Sasaki et al., *A New Monocyclic Fluoropolymer for 157-nm Photoresists*, Journal of Photopolymer Science and Technology, vol. 17, No. 4, 2004, pp. 639-644.
European Search Report dated Jan. 4, 2010.

* cited by examiner

*Primary Examiner* — Amanda C. Walke
(74) *Attorney, Agent, or Firm* — Crowell & Moring LLP

(57) ABSTRACT

A coating material including a low-molecular or medium-molecular organic compound represented by general formula (1).

[Chemical Formula 27]

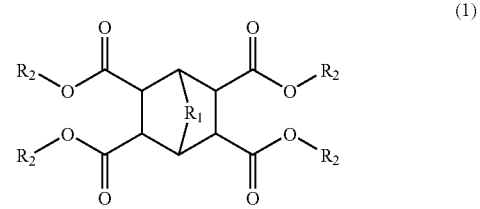

(1)

(In the formula, $R_1$ is a single bond, methylene, ethylene or oxygen; and $R_2$ is a hydrogen atom, or a hydrocarbon group, a fluorine-containing alkyl group, a cyclic form containing an aromatic group or aliphatic group, which may contain hydroxy group, carboxyl group, amino group, amide group, imide group, glycidyl group, cyano group, fluorocarbinol group, sulfonic group or sulfonylamide group, and a complex thereof, and may contain a fluorine atom, oxygen atom, nitrogen atom, silicon atom or sulfur atom, and $R_2$'s of the same type or different type may be connected by an ester bond, amide bond, ether bond, thioether bond, thioester bond or urethane bond.). This compound can be derived from a diol compound and bicyclo[2.2.2]octane-2,3:5,6-tetracarboxylic anhydride.

8 Claims, No Drawings

COATING MATERIALS CONSISTING OF LOW- OR MEDIUM-MOLECULAR ORGANIC COMPOUNDS

TECHNICAL FIELD

It relates to a coating material useful for producing films that are superior in light transmission of vacuum ultraviolet region. In particular, it relates to a coating material useful for producing photoresist films, anti-reflection films, and films formed in contact with photoresist films.

BACKGROUND OF THE INVENTION

Mass production of 90 nm fine processing devices by 193 nm lithography technique has already begun. From now on, finer, higher density and higher integration devices, such as 65 nm, 45 nm and 32 nm, are requested. The process toward the fine processing and material development are in a rapid progress. As problems toward making them finer of a resolution of 65 nm or less, etching resistance of resist, line edge roughness (LER), in which edge of pattern becomes wavy, and the like are given. To solve this task, the development is conducted actively. To improve etching resistance, there is a report example that improvement is achieved by introducing many cyclic structures into a resin. Furthermore, there are many research examples reported on the generation mechanism of LER. Its clear cause, however, has not yet been discovered. Variation of solubility relative to the developing solution and low etching resistance are assumed to be the causes.

As one example of resist resins used in 193 nm lithography, (meth)acrylic ester series resins are used. There, report examples have been presented, in which compounds having a polycyclic structure, such as adamantyl group, norbornel group or a cholesterol derivative, at an ester moiety, have been introduced in order to improve etching resistance. However, if many of such polycyclic structure are introduced into the resin to improve etching resistance, there occurs lowering of other properties necessary for resist materials, such as solvent solubility, adhesion to substrate, transmittance relative to excimer laser in vacuum ultraviolet region, and the like. Furthermore, even if many of the polycyclic structure have been introduced, etching resistance is inferior as compared with hydroxy-styrene series resins used in 254 nm lithography. Therefore, a further improvement of etching resistance is requested. On the other hand, there are examinations on resins having a cyclic structure at the polymer main chain, as an approach that is different from (meth)acrylic ester series resins. Although there are examples in which it has been tried to improve etching resistance by containing cyclopentane ring or cyclohexane ring in polymer main chains, the improvement of etching resistance has not been achieved in the case of trying to have a balance with other properties such as solvent solubility, transmittance, and contrast of resolution.

As mentioned above, there has been a demand for the production of a novel material having a sufficient etching resistance as resist material and other necessary properties such as transmittance, adhesion and solvent solubility.

Non-patent Publication 1: Takuya Hagiwara, Yasuhide Kawaguchi, et al, J. Photopolym. Sci. Technol., 16, 557 (2003)

Non-patent Publication 2: Francis Houlihan, Will Conley, Larry Rhodes, et al, J. Photopolym. Sci. Technol., 16, 581 (2003)

Non-patent Publication 3: Shinichi Kanna, Sanjay Malik, et al, J. Photopolym. Sci. Technol., 16, 595 (2003)

Non-patent Publication 4: Takashi Sasaki, Shigeo Irie, Toshiro Itani, et al, J. Photopolym. Sci. Technol., 17, 639 (2004)

SUMMARY OF THE INVENTION

It is a task of the present invention to provide a coating material useful for producing a film that is superior in light transmission of vacuum ultraviolet region and has preferably high etching resistance, high solubility in solvent or high adhesion to substrate, particularly a coating material useful for producing a film that is capable of improving line edge roughness, in which edge of pattern becomes wavy, in the case of using it for photoresist use.

As a result of examining the cause of line edge roughness, in which edge of pattern becomes wavy, the present inventors have obtained knowledge that the cause is distribution of the molecular weight of a resin used as a resist film. As a result of an eager examination for solving the above task, we have found that a tetracarboxylic acid or its ester form having a polycyclic structure, such as a particular norbornene ring, at the central structure is preferable for solving the above task. That is, we have found that, in the case of using it as photoresist, lithography characteristic is improved by making the molecular weight used for coating material low to fall in a region different from that of polymers, that it is made to have a high etching resistance by cyclic structure, and that, in the case of using it at an oscillation wavelength of ArF excimer laser, high transparency is shown at a 193 nm wavelength region of the oscillation wavelength of the laser by not containing aromatic group. Furthermore, we have found that it is possible to obtain high adhesion to substrate, superior film forming property, alkali development property, high solvent solubility and the like by appropriately selecting the protecting groups of the carboxylate, thereby completing the present invention.

The present invention provides a coating material comprising a low-molecular or medium-molecular organic compound represented by general formula (1). The low-molecular or medium-molecular organic compound forming a coating material of the present invention has a point that it does not contain a repeating unit formed by a polymerization reaction such as radical polymerization such as that of ordinary polymer compounds and does not fall under the category of ordinary polymer compounds even viewed from molecular weight. From this viewpoint, it is a coating material having a concept that is totally different from that of conventional ones. A coating material comprising a low-molecular or medium-molecular organic compound represented by general formula (1) of the present invention is treated as one in which the coating material has 90-100%, preferably 95-100%, more preferably 98-100%, of the single compound.

[Chemical Formula 1]

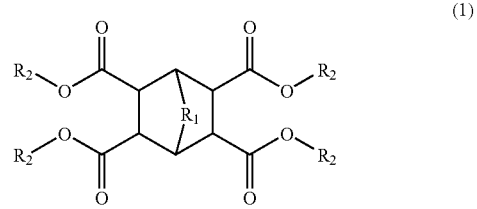

(1)

[In the formula, $R_1$ is a single bond, methylene, ethylene or oxygen; and $R_2$ is one selected from the group consisting of (a) a hydrogen atom, (b) a hydrocarbon group, (c) a fluorine-containing alkyl group, (d) a cyclic form containing an aromatic group or aliphatic group, the hydrocarbon group, the fluorine-containing alkyl group or the cyclic form optionally containing a hydroxy group, carboxyl group, amino group, amide group, imide group, glycidyl group, cyano group, fluorocarbinol group, sulfonic group or sulfonyl-amide group, and (e) a complex of at least two selected from the group consisting of the hydrocarbon group, the fluorine-containing alkyl group, and the cyclic form, and $R_2$ may contain a fluorine atom, oxygen atom, nitrogen atom, silicon atom or sulfur atom, and $R_2$'s of the same type or different type may be connected by an ester bond, amide bond, ether bond, thioether bond, thioester bond or urethane bond.]

In the present invention, at least one of $R_2$ may be a group represented by general formula (2) or (3).

[Chemical Formula 2]

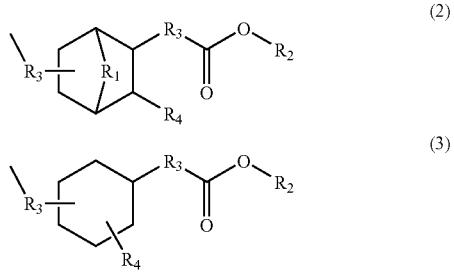

(In the formula, $R_1$ and $R_2$ are the same as those of general formula (1). $R_3$ is a single bond, a straight-chain alkylene group or an alkylene group optionally containing a branch or alicyclic structure; and $R_4$ is one selected from the group consisting of (a) a hydrogen atom, (b) a hydrocarbon group, (c) a fluorine-containing alkyl group, (d) a cyclic form containing an aromatic group or aliphatic group, the hydrocarbon group, the fluorine-containing alkyl group or the cyclic form containing a hydroxy group, carboxyl group, amino group, amide group, glycidyl group, cyano group, fluorocarbinol group or sulfonic group, and (e) a complex of at least two selected from the group consisting of the hydrocarbon group, the fluorine-containing alkyl group, and the cyclic form, and $R_4$ may contain a fluorine atom, oxygen atom, nitrogen atom, silicon atom or sulfur atom.).

Furthermore, in the present invention, at least a part of $R_2$ may be general formula (4).

[Chemical Formula 3]

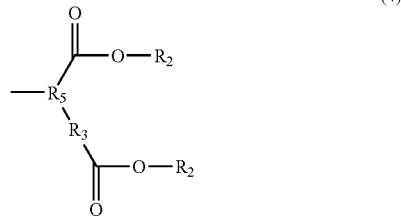

(In the formula, $R_2$ is the same as that of general formula (1), and $R_3$ is the same as that of general formal (2). $R_5$ is

[Chemical Formula 4]

or a $C_3$-$C_{15}$ organic group containing a cyclic structure.).

It is possible to introduce a lactone group, an alkali-soluble group, an acid-labile group that is restored to an alkali-soluble group by the action of acid, or hexafluorocarbinol group, into at least a part of the above $R_2$ or $R_4$.

Furthermore, it is possible to use the above organic compound composing a coating material of the present invention as a film that is superior in light transmission in vacuum ultraviolet region, particularly in a wave-length range that is the same as a light wavelength (197 nm) oscillated from ArF excimer laser, particularly as a photoresist film, an anti-reflection film or a film formed in contact with photoresist film.

DETAILED DESCRIPTION

The use of a coating material of the present invention easily provides resist materials, anti-reflection materials, top-coat materials and the like having high etching resistance, high solvent solubility, high adhesion to substrate or roughness improvement.

According to the present invention, there is provided a coating material comprising a low-molecular or medium-molecular organic compound represented by general formula (1).

[Chemical Formula 5]

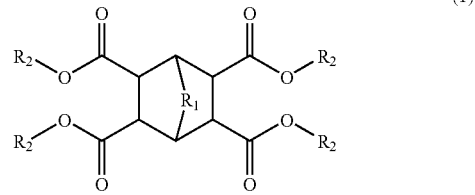

In the formula, a single bond, methylene, ethylene or oxygen is taken as $R_1$. Methylene or ethylene is preferable as $R_1$ in case that etching resistance is more necessary. An oxygen-containing, oxynorbornene ring is taken in case that higher adhesion is necessary.

$R_2$ is one selected from the group consisting of (a) a hydrogen atom, or (b) a hydrocarbon group, (c) a fluorine-containing alkyl group, (d) a cyclic form containing an aromatic group or aliphatic group, the hydrocarbon group, the fluorine-containing alkyl group or the cyclic form optionally containing a hydroxy group, carboxyl group, amino group, amide group, imide group, glycidyl group, cyano group, fluorocarbinol group, sulfonic group or sulfonylamide group, and (e) a complex of at least two selected from the group consisting of the hydrocarbon group, the fluorine-containing alkyl group, and the cyclic form, and $R_2$ may contain a fluorine atom, oxygen atom, nitrogen atom, silicon atom or sulfur atom, and $R_2$'s of the same type or different type may be connected by an ester bond, amide bond, ether bond, thioether bond, thioester bond or urethane bond.

Since the coating material of the present invention is a coating material having the single compound as a major component, the coating material does not have a large molecular weight distribution, as compared with a coating material comprising a polymer material formed by polymerization reaction or the like. Therefore, a film formed from a coating material of the present invention becomes small in variation of solubility, adhesion and the like at each part in the film body. In this way, in case that a pattern is formed by using as resist a film formed from a coating material of the present invention, it is possible to make one having an improvement in line edge roughness where edge of pattern becomes wavy.

The low molecule referred to in the present invention is one having a molecular weight of 1000 or less, and the medium molecule is one having a molecular weight of about 1000-3000. In particular, a molecular weight of about 500-2000 is preferably used.

In a low-molecular or medium-molecular organic compound for forming a coating material of the present invention, it is preferable to use a low-molecular compound as $R_2$ in case that a lower molecule is requested. Long-chain group, cyclic structure or complex thereof is preferable as at least a part of $R_2$ in the case of having a priority on moderately increasing the molecular weight from necessity of film forming characteristics and the like.

As $R_2$ having an increased molecular weight from that viewpoint and having etching resistance, it is preferable to use a structure that is the group represented by general formula (2), (3) or (4) for a part of $R_2$. That is, it is a group that can also have $R_2$ of the same type or different types by plural times as a part of $R_2$.

[Chemical Formula 6]

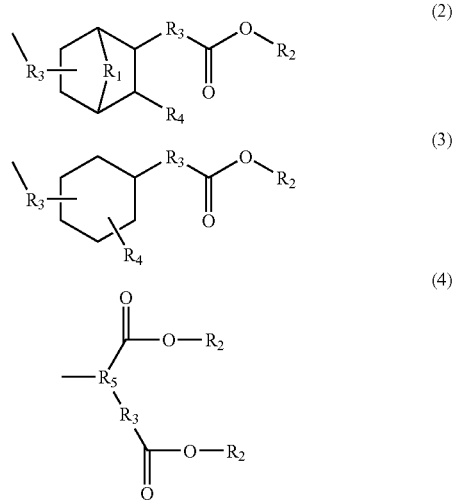

In the formula, $R_1$ and $R_2$ are the same as those of general formula (1). $R_3$ is a single bond, a straight-chain alkylene group, or an alkylene group optionally containing a branch or alicyclic structure. $R_4$ is one selected from the group consisting of (a) a hydrogen atom, (b) a hydrocarbon group, (c) a fluorine-containing alkyl group, (d) a cyclic form containing an aromatic group or aliphatic group, which may contain hydroxy group, carboxyl group, amino group, amide group, glycidyl group, cyano group, fluorocarbinol group or sulfonic group, and (e) a complex of at least two selected from the group consisting of the hydrocarbon group, the fluorine-containing alkyl group, and the cyclic form, and $R_4$ may contain a fluorine atom, oxygen atom, nitrogen atom, silicon atom or sulfur atom. $R_5$ is

[Chemical Formula 7]

or a $C_3$-$C_{10}$ trivalent organic group having a cyclic structure.). Such organic group is not particularly limited. It is possible to cite aromatic groups such as benzenetriyl, naphthalenetriyl, biphenyltriyl, toluenetriyl and xylenetriyl, and alicyclic groups such as cyclopropanetriyl, cyclo-butanetriyl, cyclopentanetriyl, cyclohexanetriyl, cycloheptanetriyl, cyclo-octanetriyl, cyclodecanetriyl, cycloundecanetriyl, bicyclohexanetriyl, adamantanetriyl, methyladamantanetriyl and norbornanetriyl. In these trivalent organic groups, the position of the bond group is arbitrary. For example, in the case of benzenetriyl, 1,2,3-, 1,2,4-, 1,3,5- and 1,2,5-benzenetriyls are included. Similarly, in the case of cyclohexanetriyl too, 1,2,3-, 1,2,4-, 1,3,5- and 1,2,5-cyclohexanetriyls are included. Of these, one having a six-membered ring unit as a ring structure such as benzenetriyl, cyclohexanetriyl or norbornanetriyl is preferable. Cyclohexanetriyl and norbornanetriyl are particularly preferable.

Then, $R_2$ is specifically explained. $R_2$ usable herein is one selected from the group consisting of (a) a hydrogen atom, (b) a hydrocarbon group, (c) a fluorine-containing alkyl group, (d) a cyclic form containing an aromatic group or aliphatic group, the hydrocarbon group, the fluorine-containing alkyl group or the cyclic form optionally containing a hydroxy group, carboxyl group, amino group, amide group, imide group, glycidyl group, cyano group, fluorocarbinol group, sulfonic group or sulfonylamide group, and (e) a complex of at least two selected from the group consisting of the hydrocarbon group, the fluorine-containing alkyl group, and the cyclic form, and $R_2$ may contain a fluorine atom, oxygen atom, nitrogen atom, silicon atom or sulfur atom, and $R_2$'s of the same type or different type may be connected by an ester bond, amide bond, ether bond, thioether bond, thioester bond or urethane bond.

As $R_2$ is specifically exemplified, a functional group having lithography function may be contained at a part of $R_2$. It is a straight-chain, branched or cyclic aliphatic hydrocarbon group or aromatic hydrocarbon group of a carbon number of 0-40 as its carbon number. It can be exemplified by methyl group, ethyl group, propyl group, isopropyl group, cyclopropyl group, n-propyl group, iso-propyl group, sec-butyl group, tert-butyl group, n-pentyl group, cyclopentyl group, sec-pentyl group, neopentyl group, hexyl group, cyclohexyl group, 1-methylcyclohexyl group, 1-ethylcyclohexyl group, norbornel group, 2-methylnorbornel group, adamantyl group, 1-methyl-adamantyl group, 1-ethyladamantyl group, vinyl group, allyl group, butenyl group, pentenyl group, ethynyl group, phenyl group, benzyl group, and 4-methoxybenzyl group. The above functional groups may partially or entirely be replaced with fluorine atoms. As ones containing oxygen atom, it is possible to cite alkoxycarbonyl group, acetal group, acyl group and the like. The alkoxycarbonyl group can be exemplified by tert-butoxycarbonyl group, tert-amyloxycarbonyl group, methoxycarbonyl group, ethoxycarbonyl group, i-propoxycarbonyl group and the like. As the acetal group, it is possible to cite linear ethers such as methoxymethyl group, methoxy-ethoxymethyl group, ethoxyethyl group, butoxyethyl group, cyclohexyl-oxyethyl group, benzyloxyethyl group, phenethyloxyethyl group, ethoxy-propyl group, benzyloxypropyl group, phenethyloxypropyl group, ethoxy-butyl group, and ethoxyisobutyl group; and cyclic ethers such as tetrahydro-furanyl group, tetrahydropyranyl group, and the like. As the acyl group, it is possible to cite acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, and the like. As the silyl group, it is possible to cite, for example, trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like. Furthermore, it is also possible to use ones in which fluorine atoms have been substituted for a part or entirety of hydrogen atoms of the above substituents. It is an object of these protecting groups to provide characteristics such as transparency, adhesion, solubility in organic solvents and alkali aqueous solutions, high glass transition temperature, crosslinking reactivity for the purpose of solder heat resistance, positive-type photosensitivity by photoacid generator, etching resistance and the like, and their proper use is possible.

For the purpose of controlling solvent solubility, compounds containing fluorocarbinol group and trifluoromethanesulfonylamide group represented by general formulas (5) and (6),

[Chemical Formula 8]

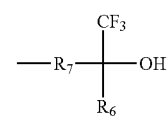
(5)

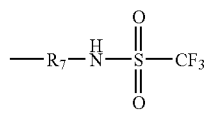
(6)

are cited. It is also possible to make one $R_2$ contain a plural number of this fluorocarbinol group or trifluoromethanesulfonylamide group. Herein, $R_6$ is preferably hydrogen, methyl, trifluoromethyl group, or the like. $R_7$ is an at least bivalent hydrocarbon group that is a straight-chain structure, branched structure, cyclic structure, polycyclic structure or aromatic group. Hydrogen atoms may partially or entirely be replaced with fluorine atoms. It is possible to use them, even if an oxygen atom, such as hydroxy group, carbonyl group or ether structure, is contained. 2-40 is preferable as a preferable carbon number. A carbon number of 2-15 is preferably taken, from the viewpoint of easiness of handling upon production and easiness of raw material supply.

It is possible to use various organic reactions, such as acid and alcohol, acid and epoxy, acid and isocyanate, acid and amine, and acid and olefin, as a reaction by reacting $R_2$ with a carboxylic acid derivative group to lead to the compound of general formula (1). It is not particularly limited.

Then, one easy process is described as an example for synthesizing the compound of general formula (1). As a raw material compound becoming a core of this case, tetracarboxylic acid series compounds of norbornene as follows are used. The raw material compounds are tetra-carboxylic acid, acid chloride, ester form or acid anhydride, as follows. That is,

[Chemical Formula 9]

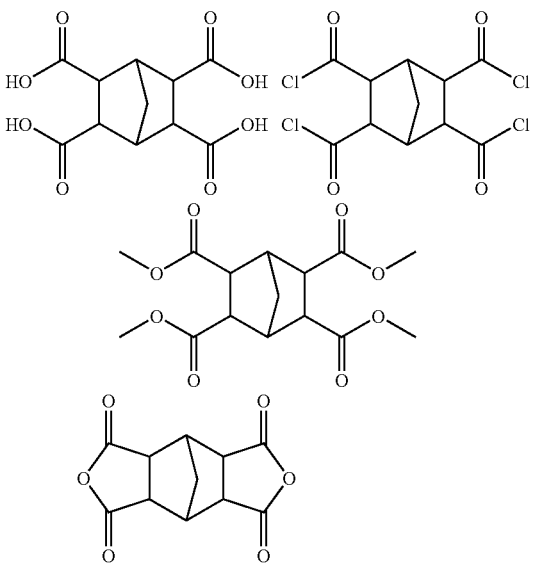

are shown as examples of the raw material.

In the present invention, a compound in which at least one of four carboxylic acids has been reacted is preferable. For the purpose of homogeneously producing only two esters, [2.2.2] octane-2,3:5,6-tetra-carboxylic anhydride, which is an acid dianhydride, is preferable. In this case, it is possible to obtain a dihalf ester or an amide acid, such as general formulas (7) or (8), for example, by reacting a hydroxy group containing compound or an amine containing compound.

[Chemical Formula 10]

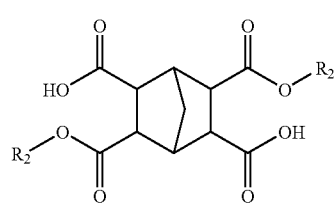
(7)

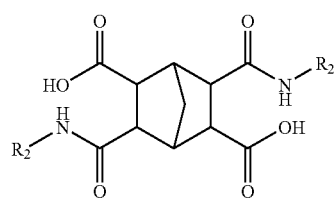
(8)

Herein, $R_2$ is the same as in general formula (1). In the present invention, a structure of general formula (2), (3) or (4) can preferably be used as $R_2$.

[Chemical Formula 11]

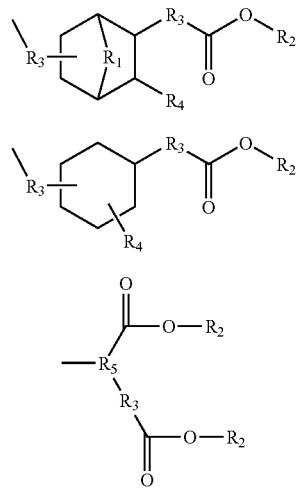

(2)

(3)

(4)

In the formulas, $R_1$ and $R_2$ are the same as in general formula (1). $R_3$ is a single bond, a straight-chain alkylene group, or an alkylene group optionally containing a branch or alicyclic structure. $R_4$ is one selected from the group consisting of (a) a hydrogen atom, (b) a hydrocarbon group, (c) a fluorine-containing alkyl group, (d) a cyclic form containing an aromatic group or aliphatic group, the hydrocarbon group, the fluorine-containing alkyl group or the cyclic form optionally containing a hydroxy group, carboxyl group, amino group, amide group, glycidyl group, cyano group, fluorocarbinol group or sulfonic group, and (e) a complex of at least two selected from the group consisting of the hydrocarbon group, the fluorine-containing alkyl group, and the cyclic form, and $R_4$ may contain a fluorine atom, oxygen atom, nitrogen atom, silicon atom or sulfur atom. $R_5$ is

[Chemical Formula 12]

or a $C_3$-$C_{10}$ trivalent organic group having a cyclic structure.

Although general formula (7) in which general formula (2) has been used is not particularly limited, various structures such as [Chemical Formula 13]

[Chemical Formula 13]

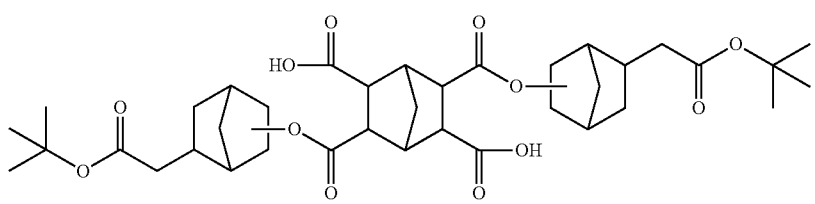

(9-a)

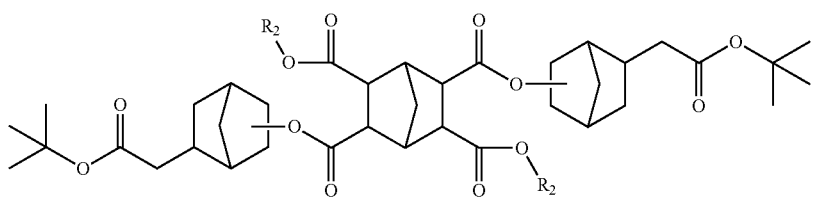

(9-b)

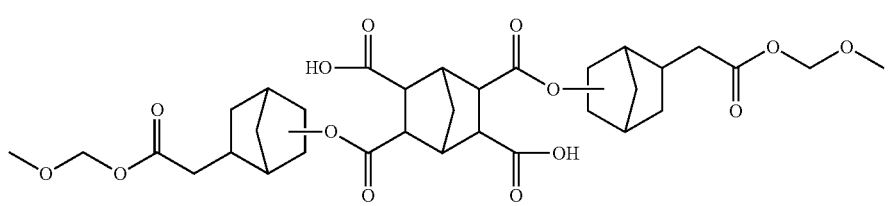

(9-c)

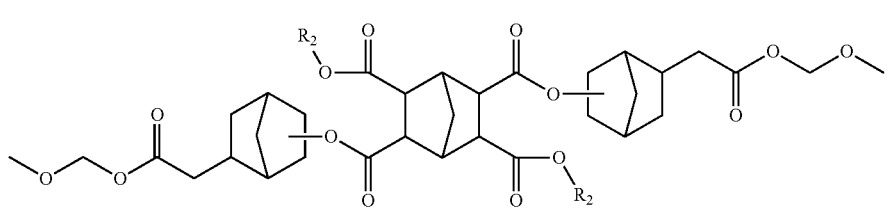

(10-a)

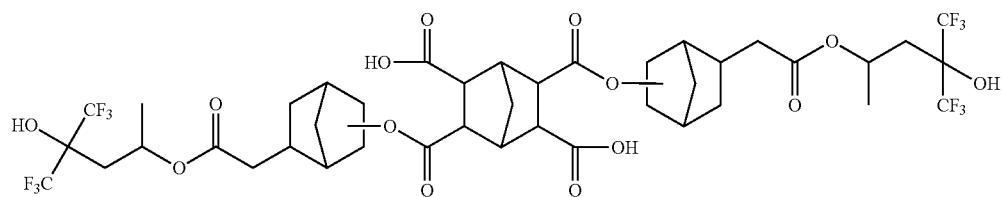
(10-b)

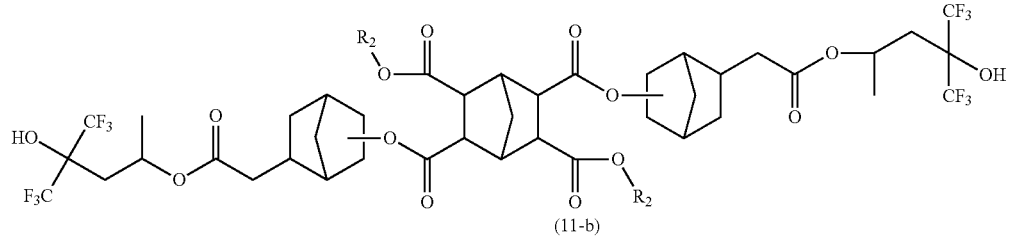
(11-a)
(11-b)

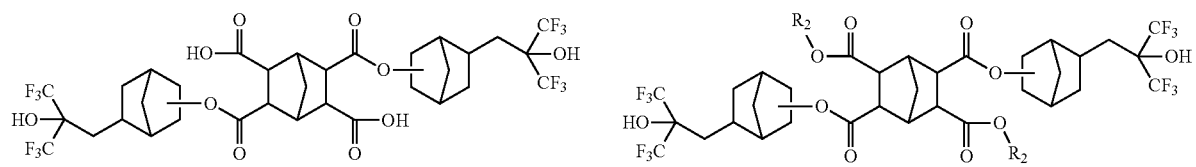
(12)

are cited. Furthermore, it is also possible to cite compounds, which have lactone structure and adamantane structure, such as general formulas (13), (14), (15) and (16). These lactones and adamantanes are examples, and it is also possible to use lactones and adamantanes of other structures without particular limitation.

[Chemical Formula 14]

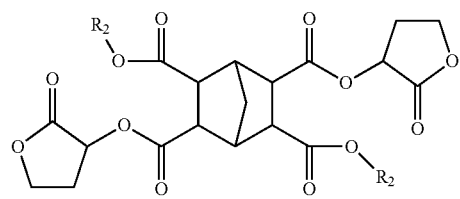
(13)

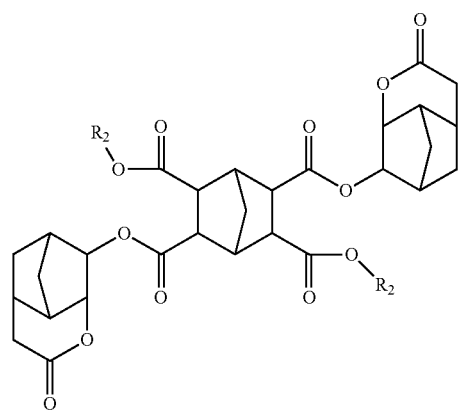
(14)

-continued

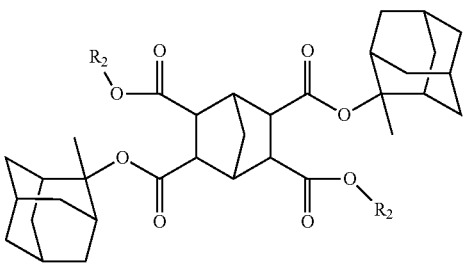
(15)
(16)

As an example of containing fluorocarbinol group, general formula (17) is preferably used as an example containing two of hexafluorocarbinol in $R_2$.

[Chemical Formula 15]

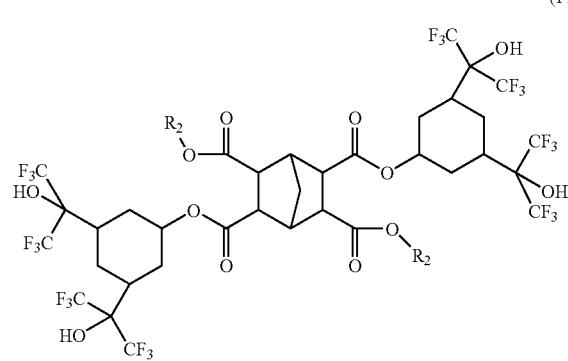
(17)

In case that the molecular size of $R_2$ is requested to have a long chain, it is possible to use an example of introducing alkylene groups shown in general formula (18) into a part of $R_2$.

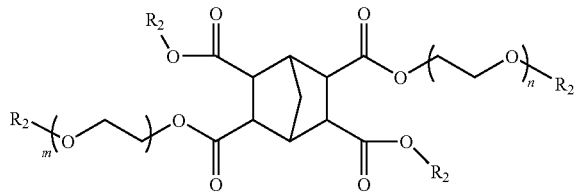

Herein, it is preferable that n and m are independently integers of 1-20.

As a specific example of the compound of general formula (4),

[Chemical Formula 17]

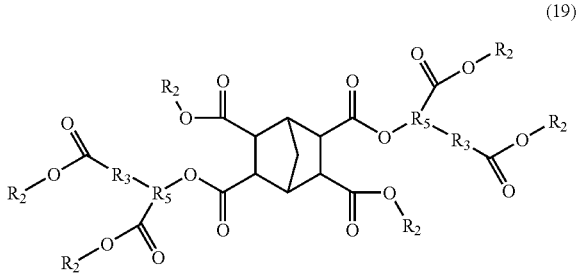

(19)

is cited. In the case of using the compound of general formula (19), it becomes possible to introduce six carboxylic acid derivative groups in one molecule. It becomes possible to lead the number of carboxylic acid derivative groups in one molecule to 8, 10, 12, 14, 16, 18 and 20 by further introducing general formula (4) into $R_2$ in general formula (19) by further exploiting the reaction. With this, it becomes possible to produce a medium molecule.

Then, the synthesis reaction of general formula (7) is explained. The reaction container is not particularly limited. In this synthesis reaction, an organic solvent may be used. As the organic solvent, it is not preferable to use a solvent that interferes with the reaction. In the case of containing much water as an impurity, it affects reactivity. Therefore, it is preferable to use a dehydration solvent. Typical ones are ester series such as ethyl acetate and n-butyl acetate; ketone series such as acetone and methyl isobutyl ketone; hydrocarbon series such as toluene and cyclohexane; chlorine series such as methylene chloride, chloroform and carbon tetra-chloride; high polarity solvents such as dimethylsufoxide, N,N-dimethyl-formamide and N-methyl-2-pyrollidone. Furthermore, it is also possible to use various solvents such as ether series, cyclic ether series, chlorofluoro-carbon series, aromatic series and fluorine series. These solvents can be used singly or in a mixture of at least two types. Although the reaction temperature is suitably changed, −50 to 300° C. is preferable, and particularly −10 to 150° C. is preferable.

It is optional to add various additives for the purpose of accelerating the reaction. The additive is not particularly limited. As examples, it is possible to use protonic acid compounds such as sulfuric acid, hydrochloric acid, hydrofluoric acid, methanesulfonic acid, p-toluenesulfonic acid, and trifluoromethanesulfonic acid; and Lewis acid compounds such as boron trifluoride, titanium tetrachloride, tin tetrachloride, zinc chloride, zinc triflate, scandium triflate, and lanthanoid triflates. However, in the case of using it as a photoresist material, it causes a defect by a metal impurity. Since that is fatal, it is more preferable to use a protonic acid compound.

Since the reaction is accelerated even by the catalytic amount of an acid compound mentioned above, the amount of the addition is not particularly limited. 0.001 mol % to 1,000 mol % relative to the raw material is preferable. From the viewpoint of washing for the subsequent acid removal, 0.1 mol % to 50 mol % is more preferable. It is also possible to similarly accelerate the reaction even by adding a basic compound. It is possible to use both of inorganic compound and organic compound. As examples, lithium hydride, sodium hydride, potassium hydride, sodium carbonate, potassium carbonate, calcium carbonate, pyridine, 2,6-lutidine, diisopropylamine, trimethylamine, triethylamine, trioctylamine, and the like are cited. From the viewpoint of contamination of metal impurities, it is more preferable to use an organic base compound. Although the amount of the addition is not particularly limited, 10 mol % to 2,000 mol % relative to the raw material is preferable. From the viewpoint of the subsequent base washing, 50 mol % to 400 mol % is more preferable.

Then, the use method of the present invention is described. A film formed from a coating material by general formula (1) of the present invention can be used as a lithography-related coating film such as photoresist material, anti-reflection film, and top-coat material.

The activation energy ray, such as light used in the lithography and electron beam, is not limited. Since norbornene ring, which is a central unit of the compound forming a coating material of the present invention, is high in transparency at 193 nm of ArF excimer laser, it is optimum for various uses using excimer laser such as KrF and $F_2$ with priority given to ArF.

It is possible to select the type of an applicable photoresist material by selecting the compound of general formula (1), as follows.

a) A positive-type, in which a group containing a protective group (hereinafter, acid-labile group) that is released by acid is contained in the compound of general formula (1) as $R_2$, such that solubility in developing solution changes by action of the acid-labile group; and b) A negative-type by making it have a hydroxy group or carboxyl group in $R_1$ or $R_2$ of the compound of general formula (1) such that it becomes possible to generate a polarity change or crosslinking reaction by chemical reaction.

In the case of using it as a positive-type photosensitive material, as a preferable acid-labile group for showing solubility in alkali aqueous solution after exposure is exemplified, a tertiary ester forming protective group, such as tert-butyl group, 1-methylcyclohexyl group, 1-ethylcyclohexyl group, 2-methylnorbornel group, 1-methyladamantyl group and 1-ethyladamantyl group, alkoxycarbonyl group, acetal group, and the like are cited. One having a fluorine atom(s) at its functional group is for further providing transparency. One having a cyclic structure is for further providing characteristics such as etching resistance and high glass transition point. They can be used differently for each applied field of the present invention.

It suffices to use a known method as the method for introducing these protective groups, and there is no particular limit. For example, it is possible to cite a method in which a carboxylic acid group is converted to an acid chloride by thionyl chloride or the like, followed by a reaction with alcohol or the like corresponding to a protective group to introduce the protective group, or a method in which, after adding a base such as sodium hydride, it is turned into a carboxylic salt, followed by a reaction with a halide or the like corresponding to a protective group to introduce the protective group. It is possible to suitably change the reaction temperature depending on reactivity due to electron density condition, bulkiness and the like. −50 to 200° C. is preferable, and −10 to 100° C. is more preferable. Although reaction solvent may not be used, its use is preferable from the viewpoint of reaction homogeneity and heat radiation. As examples, it is possible to cite ethers such as diethyl ether, tetrahydrofuran, diisopropyl ether, and di-tert-butyl ether; ketone series such as acetone and methyl isobutyl ketone; hydrocarbon series such as toluene and cyclohexane; chlorine series such as methylene chloride, chloroform, and carbon tetra-chloride; and high polarity solvents such as dimethylsulfoxide, N,N-dimethylformamide, and N-methyl-2-pyrrolidone. It is also possible to use various solvents such as chlorofluorocarbon series and aromatic series. These solvents can be used alone or in a mixture of at least two types.

In the case of introducing at least two types of protecting groups, the protection reactions may be conducted at the same time or one by one. A normal acid-labile group is the above-mentioned acid-labile group and is a functional group to be severed by acid. A polymer compound using such a solution inhibitor is not soluble or scarcely soluble in alkali aqueous solution, prior to irradiation of activation energy ray. It is hydrolyzed by an acid generated from an acid generator due to that it has been irradiated with an activation energy ray, thereby showing solubility to alkali aqueous solution. It is preferable that the compounds for photoresist of the present invention contain various combinations of lactone group for improving adhesion, fluorocarbinol group for improving solubility and hydroxy-group-containing groups, as well as the above-mentioned acid-labile group, as $R_2$.

In the case of using a coating material of the present invention as a lithography-related coating film, it is optional to add a photoacid generator to the coating material. The photoacid generator can be used by selecting an arbitrary one from those used as acid generators of chemically amplified resists. As examples of such photoacid generator, it is possible to cite bissulfonyldiazomethanes, nitrobenzyl derivatives, onium salts, halogen-containing triazine compounds, cyano-group-containing oximesulfonate compounds, other oximesulfonate compounds, and the like. These acid generators may be used alone or in a combination of at least two types. The content is selected normally in a range of 0.5-20 parts by weight relative to 100 parts by weight of the coating material. If this amount is less than 0.5 parts by weight, image-forming property is insufficient. If it exceeds 20 parts by weight, there is a tendency in which it is difficult to form a homogeneous solution and in which storage stability lowers.

As a method for using a coating material of the present invention as a lithography use, a resist pattern forming method of a conventional lithography technique is used. To preferably conduct it, at first a coating solution having the coating material and an organic solvent is applied on a support such as silicon wafer, followed by drying to form a photosensitive layer, and this is irradiated with an excimer laser light by an exposure apparatus or the like through a desired mask pattern, followed by heating. Then, this is subjected to a developing treatment using a developing solution, for example, an alkali aqueous solution, such as 0.1-10 wt % tetramethyl-ammonium hydroxide aqueous solution. It is possible by this forming method to obtain a pattern conforming to the mask pattern. As the above organic solvent, at least one type selected from propylene glycol monomethyl ether acetate, n-butanol, and ethyl lactate is preferably used.

A resist film formed from a coating material of the present invention can improve line edge roughness (LER) in which edge of pattern becomes wavy. Therefore, it is optional to improve LER of a resist film formed from a photoresist polymer generally used, by mixing a photoresist polymer that is formed by a polymerization reaction such as radical polymerization, with a coating material of the present invention.

Furthermore, it is optional to form an anti-reflection material for semiconductor production, which is used for an upper layer of a film formed as resist, while the film formed as resist is used as a support, or a lower layer of the film formed as resist, from a coating material of the present invention. In the case of the latter, a silicon wafer or a silicon wafer having another film formed becomes the support. In the case of these anti-reflection film uses, the acid-labile group may be not an essential component in $R_2$, but it is preferable to have a firm adhesion to the base member or photoresist film. In addition, it is optional to form a top coat material for immersion lithography from a coating material of the present invention.

In order to apply a coating material of the present invention to a support, it is preferable to dissolve a coating material of the present invention in an organic solvent or a mixed solution of an alkali aqueous solution and water for use.

In the case of forming the above top coat material, as a usable organic solvent, a solvent that hardly corrodes the resist layer of the lower layer and hardly extracts additives and the like from the resist film and that has a boiling point range suitable for spin coating, that is, a boiling point of about 70° C. to 170° C., is preferably selected.

Specifically, it depends on the resist film composition of the lower layer. Various hydrocarbon solvents, alcohols, ethers, esters, fluorine-series solvents are preferable. Preferably, hydrocarbon solvents of alkanes, such as pentane, hexane, heptane, octane, nonane and decane, and alicyclic ones, and hydrocarbon-series alcohols, such as butanols (normal, iso form, and tertiary), methyl ethyl carbinol, pentanol, amyl alcohol, hexyl alcohol and heptyl alcohol, are preferably used. More preferably, hydrocarbon-series solvents, in which fluorines have partially or entirely been substituted, and fluorine-series solvents are preferably used. By using fluorine, it becomes possible to effectively dissolve a polymer compound of the present invention and to conduct a coating that does not cause damage to the resist film of the foundation.

According to the present invention, it is possible to previously add an additive, such as acid generator or quencher, to the top coat solution, for the purpose of minimizing the effect of the case of having an extract from the lower layer. In particular, in the case of adding an acid generator in the present invention, the effect of improving the resolution performance of the lower layer resist in immersion lithography shows up.

Furthermore, it is possible to preferably use a hydrophobic additive for suppressing the effect on swelling or penetration of water, an acidic additive for accelerating solubility in developing solution, and the like.

It is possible to use a top coat film formed from a coating material of the present invention, with no limitation on the type of the resist of the lower layer. That is, it can preferably be used, even if the lower layer resist is an arbitrary resist system such as negative type, positive type or composite type. Furthermore, it can be used without dependence on various light sources such as activation energy rays such as 193 nm ArF excimer laser and $F_2$ laser of vacuum ultraviolet region represented by 157 nm, which correspond to the recent trend for finer semiconductors, or electron beam and X ray. In particular, a top coat of the present invention is preferably applied in immersion lithography.

That is, in the case of using the present invention in device production using immersion lithography, at first a solution of resist composition is applied by spinner onto a supporting body, such as silicon wafer or semiconductor producing substrate, followed by drying to form a photosensitive layer, applying a coating material of the present invention on its top surface by spinner for top coating, drying, then immersion in water or the like, and laser light irradiation through a desired mask pattern. Then, this is heated. Then, there are two methods, a case that is a first method in which only the top coat layer is removed by using a removing solution that does not damage the photoresist, and then a photoresist development using an alkali developing solution is conducted; and a second method in which the top coat is fully dissolved and at the same time the photoresist film of the exposed portion is dissolved by conducting a developing treatment using a developing solution such as an alkali aqueous solution such as 0.1-10 wt % tetramethylammonium hydroxide aqueous solution, thereby leaving only the resist pattern by one-step development. In the case of the first method, the compound of the present invention may be insoluble or soluble in the developing solution. In the case of selecting the second method, it is necessary to conduct design and synthesis to make the compound of the present invention soluble in the developing solution.

It is possible to use a coating material of the present invention in varnish condition where it is dissolved in organic solvent, or powder condition, film condition or solid condition. In the case of using it in varnish, it can be applied onto a supporting body such as glass, silicon wafer, metal, metal oxide, ceramics or resin, by a method normally used, such as spin coating, spray coating, flow coating, impregnation coating, or brush coating.

Then, the present invention is described in more detail by examples.

Synthesis Example 1

Synthesis of Compound 24

In a 1 L, four-necked flask, under nitrogen atmosphere, compound 20 (10.00 g) and compound 21 (13.05 g) were mixed in 1,2-dichloroethane (84.6 ml) at room temperature. This mixed solution was immersed in an iced water bath to adjust the inside temperature to 5° C. Then, triethylamine (21.42 g) stored in a dropping funnel was added dropwise under stirring by spending 55 minutes. After the dropping, stirring was conducted for 10 minutes under cooling in an iced water bath, followed by heating up to 60° C. in an oil bath and stirring for 8 hours. After cooling the reaction solution by standing still, saturated sodium hydrogencarbonate aqueous solution was gradually added. Diisopropyl ether (350 ml) was added to this mixed solution, followed by transferring the solution into a separatory funnel to separate the two layers. The obtained organic layer was further washed with saturated sodium hydrogencarbonate aqueous solution two times, with water one time, and with saturated brine one time. Then, the organic layer after washing was dried with anhydrous magnesium sulfate, followed by distilling the solvent off with an evaporator. Furthermore, the solvent was sufficiently removed by using a vacuum pump, thereby obtaining a crude product (22.58 g) of compound 22.

[Chemical Formula 18]

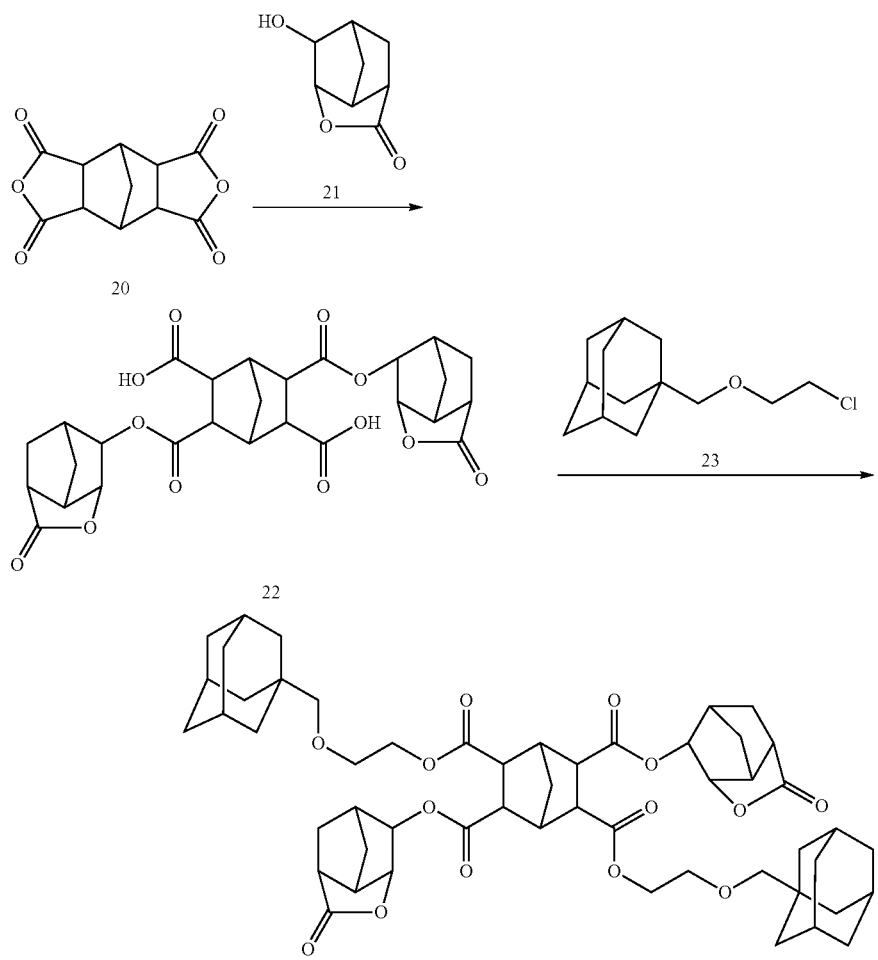

Then, in a 1 L, four-necked flask, under nitrogen atmosphere, the crude product (22.58 g) of compound 22 was mixed in tetrahydrofuran (52.9 ml) under room temperature. Then, sodium hydride (2.19 g) was gradually added portion by portion. After adding the total amount, stirring was conducted in nitrogen atmosphere under room temperature for 30 minutes. Furthermore, to this mixed solution, a tetrahydrofuran (30.0 ml) solution of compound 23 (18.97 g) was added by spending 50 minutes using a dropping funnel, followed by stirring for 8 hours. After gradually adding saturated ammonium chloride aqueous solution to this reaction solution, diisopropyl ether (350 ml) was further added to this mixed solution, followed by transferring the solution into a separatory funnel to separate the two layers. The obtained organic layer was further washed with water one time and with saturated brine one time. Then, the organic layer after washing was dried with anhydrous magnesium sulfate, followed by distilling the solvent off with an evaporator. Then, isopropyl alcohol/n-hexane (20 g/180 g) was added to a crude product (35.44 g) of the obtained compound 24. After heating dissolution at 40° C., it was gradually cooled down to room temperature to conduct a recrystallization, thereby obtaining compound 24 (21.62 g).

Synthesis Example 2

Synthesis of Compound 29 reaction solution by standing still, saturated sodium hydrogencarbonate aqueous solution was gradually added. Diisopropyl ether (200 ml) was added to this mixed solution, followed by transferring the solution into a separatory funnel to separate the two layers. The obtained organic layer was further washed with water one time and with saturated brine one time. Then, the organic layer after washing was dried with anhydrous magnesium sulfate, followed by distilling the solvent off with an evaporator. Furthermore, the solvent was sufficiently removed by using a vacuum pump, thereby obtaining a crude product (30.59 g) of compound 27.

Then, in a 1 L, four-necked flask, under nitrogen atmosphere, the crude product (30.59 g) of compound 27 was mixed in tetrahydrofuran (53.8 ml) under room temperature. Then, sodium hydride (1.94 g) was gradually added portion by portion. After adding the total amount, stirring was conducted in nitrogen atmosphere under room temperature for 30 minutes. Furthermore, to this mixed solution, a tetrahydrofuran (20.0 ml) solution of compound 28 (7.64 g) was added by spending 30 minutes using a dropping funnel, followed by stirring for 4 hours. After gradually adding saturated ammonium chloride aqueous solution to this reaction solution, diisopropyl ether (200 ml) was further added, followed by transferring the solution into a separatory funnel to separate the two layers. The obtained organic layer was further washed with water one time and with saturated brine one time. Then, the organic layer after washing was dried with anhydrous

[Chemical Formula 19]

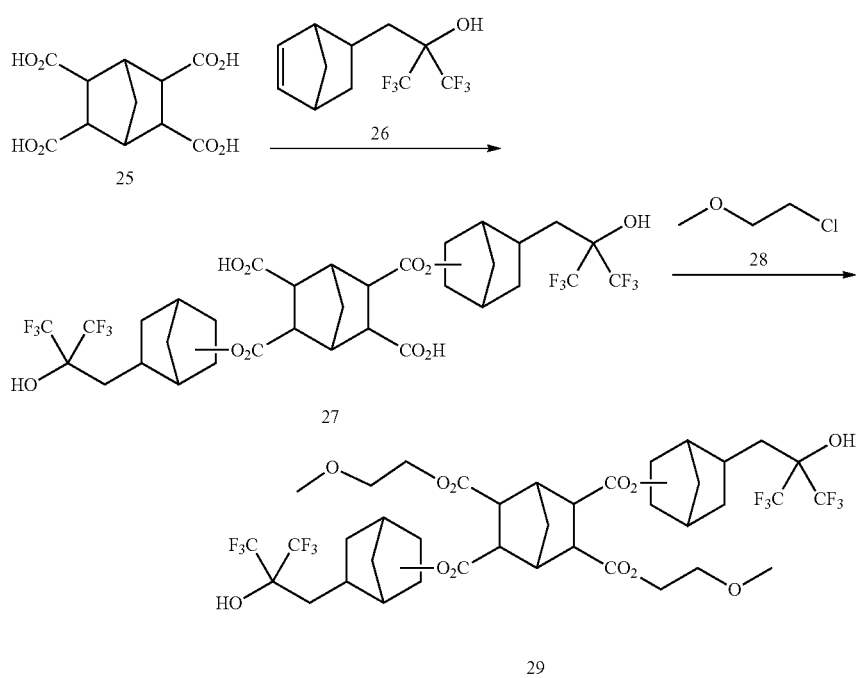

In a 1 L, four-necked flask, under nitrogen atmosphere, compound 25 (10.00 g) and compound 26 (20.15 g) were mixed in xylene (73.5 ml) at room temperature. To this mixed solution, p-toluenesulfonic acid (0.316 g) was added under stirring. Then, this mixed solution was heated up to 90° C. in an oil bath, followed by stirring for 6 hours. After cooling the magnesium sulfate, followed by distilling the solvent off with an evaporator. Then, diisopropyl ether/toluene (20 g/180 g) was added to a crude product (33.39 g) of the obtained compound 29. After heating dissolution at 40° C., it was gradually cooled down to room temperature to conduct a recrystallization, thereby obtaining compound 29 (23.72 g).

Synthesis Example 3

Synthesis of Compound 33

[Chemical Formula 20]

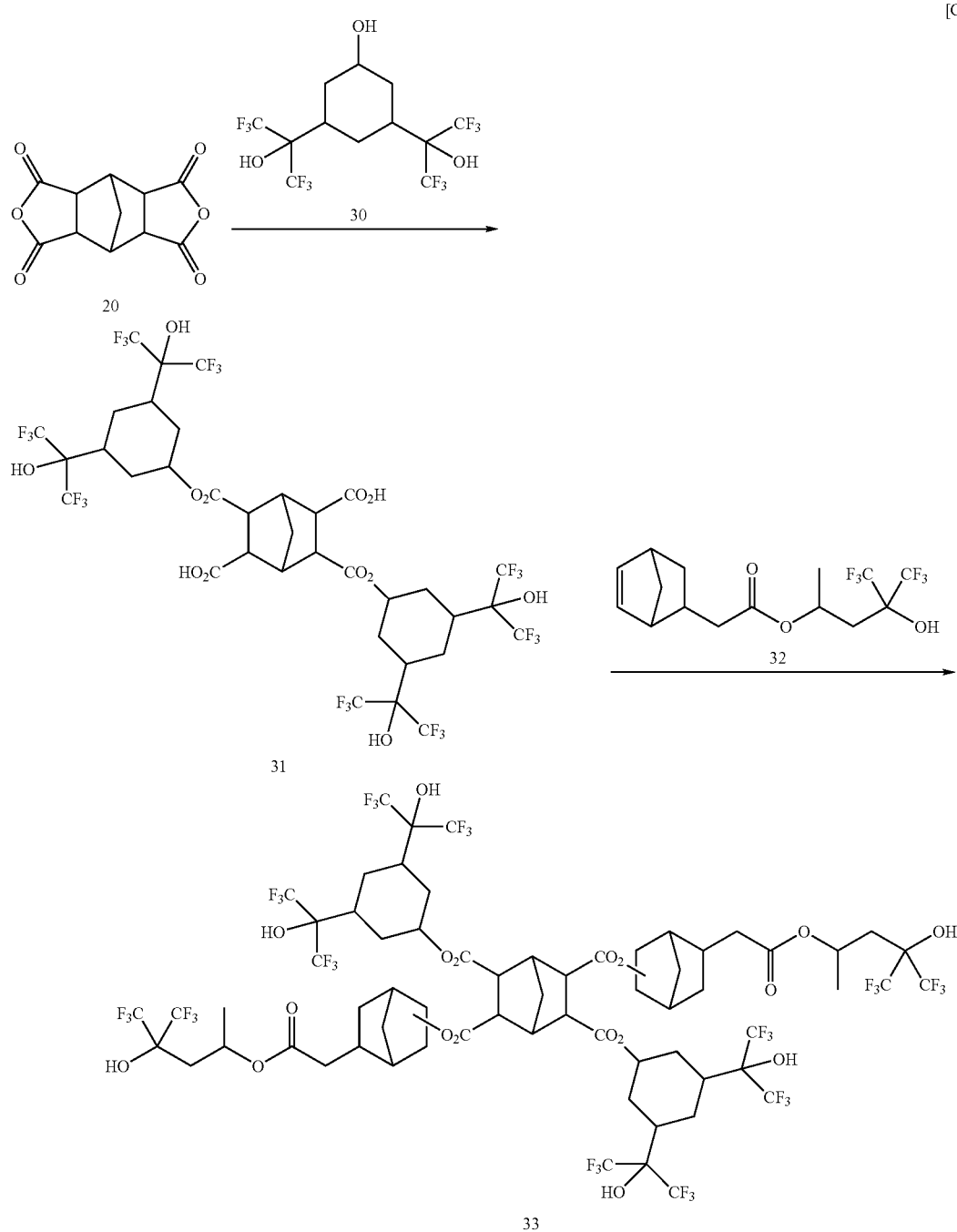

In a 1 L, four-necked flask, under nitrogen atmosphere, compound 20 (10.00 g) and compound 30 (18.30 g) were mixed in toluene (64.7 ml) at room temperature. This mixed solution was immersed in an iced water bath to adjust the inside temperature to 5° C. Then, a toluene (20.0 ml) solution of 2,6-dimethylpyridine (9.53 g), stored in a dropping funnel, was added drop-wise under stirring by spending 35 minutes. After the dropping, stirring was conducted for 8 minutes under cooling in an iced water bath, followed by heating up to 60° C. in an oil bath and stirring for 6 hours. After cooling the reaction solution by standing still, saturated ammonium chloride aqueous solution was gradually added. Diisopropyl ether (400 ml) was added to this mixed solution, followed by transferring the solution into a separatory funnel to separate the two layers. The obtained organic layer was further washed with saturated ammonium chloride aqueous solution one time, with water one time, and with saturated brine one time. Then, the organic layer after washing was dried with anhydrous magnesium sulfate, followed by distilling the solvent off with an evaporator. Furthermore, the solvent was sufficiently removed by using a vacuum pump, thereby obtaining a crude product (41.01 g) of compound 31.

Then, in a 1 L, four-necked flask, under nitrogen atmosphere, compound 31 (41.01 g) and compound 32 (26.85 g) were mixed in toluene (74.5 ml) at room temperature. To this mixed solution, p-toluenesulfonic acid (0.321 g) was added under stirring. Then, this mixed solution was heated in an oil bath up to 45° C., followed by stirring for 18 hours. After cooling the reaction solution by standing still, saturated sodium hydrogen-carbonate aqueous solution was gradually added. Diisopropyl ether (300 ml) was added to this mixed solution, followed by transferring the solution into a separatory funnel to separate the two layers. The obtained organic layer was further washed with water one time and with saturated brine one time. Then, the organic layer after washing was dried with anhydrous magnesium sulfate, followed by distilling the solvent off with an evaporator. Then, diisopropyl ether/toluene (30 g/270 g) was added to a crude product (62.31 g) of the obtained compound 33. After heating dissolution at 50° C., it was gradually cooled down to room temperature to conduct a recrystallization, thereby obtaining compound 33 (45.33 g).

Synthesis Example 4

Synthesis of Compound 40

$R^2=$

[Chemical Formula 22]

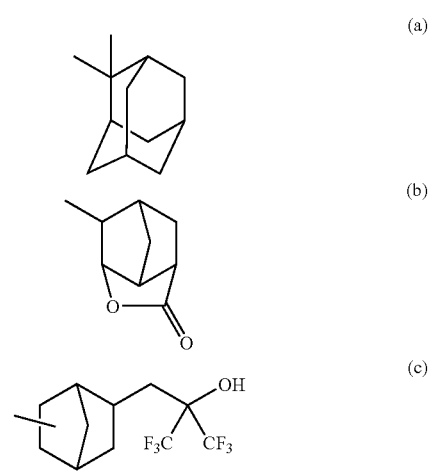

In a 1 L, four-necked flask, under nitrogen atmosphere, compound 20 (10.00 g), and compound 34 (9.83 g), which was monoxydibasic acid (malic acid), were mixed in toluene (64.7 ml). This mixed solution was immersed in an iced water bath to adjust the inside temperature to 5° C. Then, a toluene (20.0 ml) solution of triethylamine (8.57 g), stored in a dropping funnel, was added dropwise under stirring by spending 40 minutes. After the dropping, stirring was conducted for 8

[Chemical Formula 21]

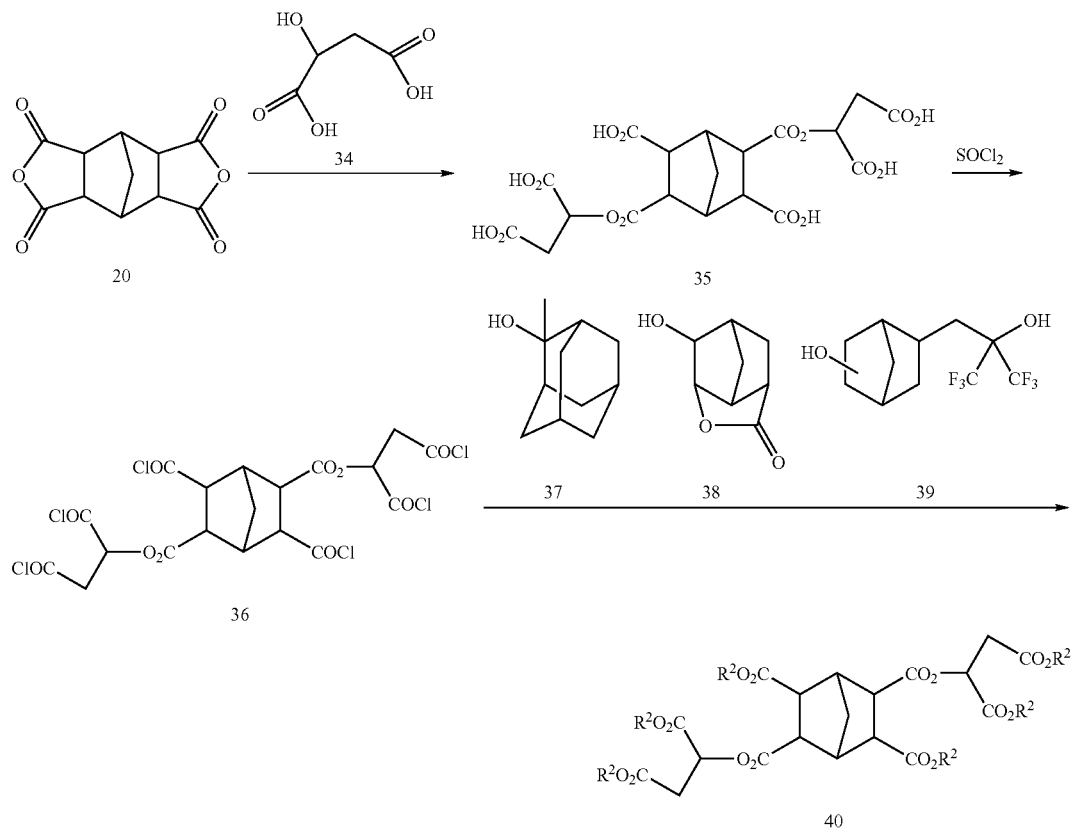

minutes under cooling in an iced water bath. Then, it was heated up to 60° C. in an oil bath, followed by stirring for 6 hours. After cooling the reaction solution by standing still, toluene was distilled off with an evaporator. To the obtained residue, 200 ml of 5% potassium hydroxide aqueous solution were added. Under stirring, stirring was conducted at room temperature for 15 hours. Then, 1N hydrochloric acid was gradually added, while it was immersed in an iced water bath. The precipitated crystals were collected by filtration, and the crystals were washed with water. These crystals were sufficiently dried by using a vacuum pump, thereby obtaining a crude product (21.22 g) of compound 35.

Then, in a 1 L, four-necked flask, under nitrogen atmosphere, the crude product (20.01 g) of compound 35 and thionyl chloride (200.0 ml) were mixed together at room temperature. Furthermore, N,N-dimethyl-formamide (2.0 ml) was added under stirring at room temperature. Then, the inside temperature was heated up to 70° C., followed by stirring for 16 hours. (At the point of 8 hours on the way, N,N-dimethylformamide (2.0 ml) was added again.) Then, thionyl chloride was distilled off, followed by adding toluene (500 ml) to the obtained residue and conducting distillation again to remove toluene and thionyl chloride. Furthermore, the obtained residue was dried by using a vacuum pump equipped with a soda-lime trap, thereby obtaining a crude product (23.12 g) of compound 36.

Then, in a 1 L, four-necked flask, under nitrogen atmosphere, the crude product (23.12 g) of compound 36, compound 37 (18.75 g), compound 38 (8.69 g) and compound 39 (16.48 g) were mixed together in toluene (326.0 ml) at room temperature. This mixed solution was immersed in an iced water bath to adjust the inside temperature to 5° C. Then, a toluene (50.0 ml) solution of 2,6-dimethylpyridine (25.37 g), stored in a dropping funnel, was added under stirring by spending 35 minutes. After the dropping, stirring was conducted for 8 minutes under cooling in an iced water bath. Then, it was heated up to 40° C. in an oil bath, followed by stirring for 12 hours. The reaction solution was cooled by standing still. Then, the precipitated hydro-chloride was separated by filtration. To the obtained toluene solution, saturated ammonium chloride aqueous solution was gradually added. To this mixed solution, diisopropyl ether (400 ml) was added, followed by transferring the solution into a separatory funnel to separate the two layers. The obtained organic layer was further washed with saturated ammonium chloride aqueous solution two times, with water one time, and with saturated brine one time. Then, the organic layer after washing was dried with anhydrous magnesium sulfate, followed by distilling the solvent off with an evaporator. Then, diisopropyl ether/toluene (20 g/480 g) was added to a crude product (45.12 g) of the obtained compound 40. After heating dissolution at 50° C., it was gradually cooled down to room temperature to conduct a recrystallization, thereby obtaining compound 40-A (35.33 g).

Then, compound 40-B (37.61 g) was obtained by a similar method using a crude product (23.12 g) of compound 36, compound 37 (28.13 g), compound 38 (4.2 g), and compound 39 (18.1 g).

Example 1

Four types of coating materials were made by selecting compounds 24, 29, 40-A and 40-B obtained in the above Synthesis Examples 1 to 4. Each coating material was dissolved in propylene glycol monomethyl ether acetate solvent to adjust the solid matter content to 12%. Triphenylsulfonium triflate (made by Midori Chemical, TPS105) as an acid generator was dissolved 0.5% in the thus obtained solutions, thereby preparing four types of coating solutions for obtaining resists.

Then, the coating solutions for obtaining resists were filtered by a membrane filter having a pore size of 0.02 μm. Then, the solutions were applied on silicon wafers by spin coating to obtain resist films having a film thickness of 250 nm.

After conducting a preliminary baking at 120° C., an exposure to a 248 nm ultraviolet ray was conducted through a photomask. Then, a post exposure baking was conducted at 130° C. Then, a development was conducted at 23° C. for 1 minute using 2.38 wt % tetramethylammonium hydroxide aqueous solution. As a result, there was confirmed a positive-type behavior that only the exposed portion dissolves in the developing solution. At the same time, a high-resolution pattern was obtained from each resist solution. There were almost not found inferiority defect in adhesion to substrate, film-forming inferiority defect, and development defect.

Example 2

Compounds 22, 27, 31 and 33 obtained by Synthesis Examples 1-3 were used as coating materials. Each coating material was dissolved in a mixed solvent of 2-octanol (10%), hexyl alcohol (40%) and n-decane (50%) to adjust the solid matter content to 5 wt %, thereby obtaining coating solutions for obtaining four types of top coat used in photoresist step. Dissolution property was good, and even two days later a change such as precipitation was not found.

Then, a polymer solution prepared by dissolving a three-component copolymer by ethyladamantane methacrylate/hydroxyadamantane methacrylate/γ-butyrolactone methacrylate in propylene glycol methyl-acetate was applied by spin coating at 1500 rpm for 60 seconds, followed by drying at 110° C. for 60 seconds, thereby obtaining a resist polymer film having a thickness of about 180 nm.

Then, each of the four types of the coating solutions for obtaining top coats of the present example was applied on the photoresist film to have a thickness of about 45 nm, followed by baking at 110° C. for 50 seconds, thereby obtaining a homogeneous top coat film on the resist film. These two-layer films were immersed in 2.38 wt % tetramethylammonium hydroxide aqueous solution for 60 seconds. With this, only the upper layer cover coat film was dissolved rapidly. In each case of the four-types of top coat, only 45 nm film thickness of the original photoresist film remained.

The above three-component copolymer was obtained by the after-mentioned Referential Synthesis Example.

Referential Synthesis Example

A 500 ml round-bottom flask equipped with a reflux condenser and a stirrer was charged with 30 g of ethyladamantane methacylate (EAD), 32 g of hydroxyadamantane methacrylate (HAD), 14 g of γ-butyrolactone meth-acrylate (GBL), 1.5 g of azobisisobutyronitrile (AIBN), 0.3 g of n-dodecyl mercaptan, and 250 g of methyl ethyl ketone, followed by replacing the inside of the flask with nitrogen. This was heated in an oil bath of 75° C., followed by stirring for 20 hours. After the reaction, the reaction solution was introduced into 1 liter of water/methanol (9/1), followed by stirring. The resulting precipitate was taken out by filtration. Then, the precipitate was dissolved in isopropyl alcohol, followed by introducing it again into 1 liter of water/methanol (9/1) and stirring. The resulting precipitate was taken out by filtration. Then, it was dried at 60° C. for 24 hours, thereby obtaining 54 g of a polymer compound of a white-color solid matter. The weight average molecular weight determined from GPC (standard: polystyrene) was 12300.

Example 3

Compounds 24, 29, 40-A and 40-B obtained by Synthesis Examples 1-4 were used as coating materials. Each coating material was dissolved in propylene glycol monomethylether acetate to adjust the solid matter content to 14%. In the thus obtained solution, triphenylphosphonium triflate (made by Midori Chemical, TPS105) as an acid generator was dissolved 0.5%, thereby preparing four types of coating solutions.

These were applied onto calcium fluoride plates (thickness: 2 mm) by spin coating, thereby producing films having a film thickness of 100 nm. These films were subjected to the measurement of light transmittance at wavelengths of 248 nm, 193 nm and 157 nm by using a spectrophotometer (VU-201 SS made by Bunkoh-Keiki Co., LTD.). The results are shown in

TABLE 1

The film obtained by the present example showed high light transmittances in ultraviolet region to vacuum ultraviolet region

| | Transmittance (%) | | |
|---|---|---|---|
| | 248 nm | 193 nm | 157 nm |
| Film formed from Compound 24 | 99 | 81 | 42 |
| Film formed from Compound 29 | 99 | 83 | 49 |
| Film formed from Compound 40-A | 99 | 85 | 52 |
| Film formed from Compound 40-B | 99 | 86 | 54 |

The invention claimed is:

1. A coating material comprising a low-molecular or medium-molecular organic compound represented by general formula (1),

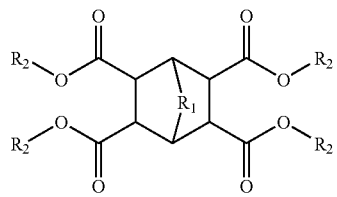

wherein $R_1$ is a single bond, methylene, ethylene or oxygen;

$R_2$ is one selected from the group consisting of (a) a hydrogen atom, (b) a hydrocarbon group, (c) a fluorine-containing alkyl group, and (d) a cyclic form containing an aromatic group or aliphatic group, the hydrocarbon group, the fluorine-containing alkyl group or the cylic form optionally containing a hydroxy group, carboxyl group, amino group, amide group, imide group, glycidyl group, cyano group, fluorocarbinol group, sulfonic group or sulfonylamide group, $R_2$ may contain a fluorine atom, oxygen atom, nitrogen atom, silicon atom or sulfur atom, and $R_2$'s of the same type or different type may be connected by an ester bond, amide bond, ether bond, thioether bond, thioester bond or urethane bond, wherein in the general formula (1) at least one $R_2$ is a group represented by general formula (2) or (3),

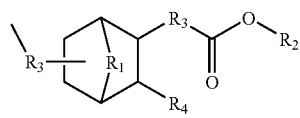

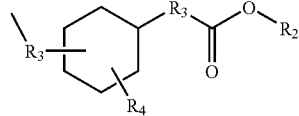

wherein $R_1$ and $R_2$ are the same as those of general formula (1), $R_3$ is a single bond, a straight-chain alkylene group, or an alkylene group optionally containing a branch or alicyclic structure; and $R_4$ is one selected from the group consisting of (a) a hydrogen atom, (b) a hydrocarbon group, (c) a fluorine-containing alkyl group, and (d) a cyclic form containing an aromatic group or aliphatic group, the hydrocarbon group, the fluorine-containing alkyl group or the cyclic form optionally containing a hydroxy group, carboxyl group, amino group, amide group, glycidyl group, cyano group, fluorocarbinol group or sulfonic group, and $R_4$ may contain a fluorine atom, oxygen atom, nitrogen atom, silicon atom or sulfur atom.

2. A coating material according to claim 1, wherein in general formula (1) at least a part of $R_2$ is general formula (4)

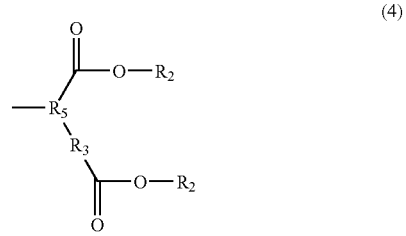

wherein $R_2$ is the same as that of general formula (1),
$R_3$ is the same as that of general formula (2), and
$R_5$ is

or a $C_3$-$C_{15}$ trivalent organic group containing a cyclic structure.

3. A coating material according to claim 1, wherein in the group represented by general formula (2) or (3) at least a part of $R_2$ or $R_4$ has a lactone group.

4. A coating material according to claim 1, wherein in the group represented by general formula (2) or (3) at least a part of $R_2$ or $R_4$ has an alkali-soluble group.

5. A coating material according to claim 1, wherein in the group represented by general formula (2) or (3) at least a part of $R_2$ or $R_4$ has an acid-labile group that is restored to an alkali-soluble group by action of acid.

6. A coating material according to claim 1, wherein in the group represented by general formula (2) or (3) at least a part of $R_2$ or $R_4$ has a hexafluorocarbinol group.

7. A coating material according to claim 1, wherein molecular weight of the low-molecular or medium-molecular organic compound represented by general formula (1) is 500-2000.

8. A process for producing a film, which is characterized in comprising a step of applying a coating solution having a coating material according to claim 1 and an organic solvent, onto a supporting body.

* * * * *